United States Patent [19]

Ziolo

[11] Patent Number: 4,877,768
[45] Date of Patent: Oct. 31, 1989

[54] PROCESSES FOR THE PREPARATION OF COPPER OXIDE SUPERCONDUCTORS

[75] Inventor: Ronald F. Ziolo, Webster, N.Y.

[73] Assignee: Xerox Corporation, Stamford, Conn.

[21] Appl. No.: 223,827

[22] Filed: Jul. 25, 1988

[51] Int. Cl.$^4$ .............................................. C01G 3/02
[52] U.S. Cl. ........................................ 505/1; 423/593; 423/604; 423/636; 423/639; 423/337; 423/263; 502/525; 502/355; 501/123; 501/126; 501/152; 501/1; 501/94; 252/521
[58] Field of Search ............... 423/604, 636, 639, 337, 423/263, 593, 593 C, 26 S; 502/525, 355; 501/123, 126, 152, 1, 94; 252/521; 427/226; 505/1

[56] References Cited

PUBLICATIONS

Guang-Yoo et al., International Journal of Modern Physics B, vol. 1, No. 2 (1987) 579–582, pp. 413–416.

A. Gupta et al., YiBa$_2$Cu$_3$O$_{7-8}$ Thin Films Grown by a Simple Spray Deposition Technique, Applied Physics, vol. 58, No. 2, 1988, pp. 163–165.

Syono et al., X-Ray and Electron Microscopic Study of a High Temperature Superconductor Y$_{0.4}$Ba$_{0.6}$CuO$_{222}$, Applied Physics, vol. 26, No. 4, Apr. 1987, L498–501.

Japanese Journal of Applied Physics, vol. 26, No. 5, May 1987, pp. L858–859.

Materials and Processing Report, "Update Report on High Tc Superconductors", vol. 2, No. 4, Jul. 1987, pp. 1–4.

Materials Research Society Symposium Proceedings, vol. 99, High Temperature Superconductors, Kayser et al., "Preparation of High Tc YBa$_2$Cu$_3$O$_{7-1}$ Powders from Nitrate and Oxalate Precursors" 1988, pp. 159–164.

Materials Research Society Symopsium Proceedings, vol. 99, High Temperature Super Conductors, Voigt et al., "A Hydroxycarbonate Route to Super Conductor Precursor Powders", 1988, pp. 635–638.

Japanese Journal of Applied Physics, vol. 26, No. 5, May 1987, "Single Crystal Preparation of Ba$_2$YCu$_3$O$_x$ from Nonstoichiometric Melts", Takekawa et al.

Japanese Journal of Applied Physics, vol. 26, No. 4, Apr. 1987, pp. L498–L501, "X-Ray and Electron Microscopic Study of a High Temperature Superconductor, etc.".

Chemistry of High-Temperature Superconductors, Chapter 7, Davison et al.; and Chapter 11, Holland et al., American Chemical Society, 1987, pp. 65–78 and 102–113.

"Manufacture and Testing of High Tc–Super Conducting Materials", Yarar et al. Advanced Ceramic Materials, vol. 2, No. 3B, 1987, pp. 372–379.

Advanced Ceramic Materials, vol. 2, No. 3B, 1987, Cima et al., "Powder Processing for Microstructural control in Ceramic Superconductors", pp. 329–336.

Advanced Ceramic Materials, vol. 2, No. 3B, 1987, pp. 656–661 "Thermal Analysis of Ba$_2$YCu$_3$O$_{7-x}$ at 700–1000C in Air" Cook et al.

Mat. Res. Soc. Symp. Proc., vol. 99, 1988 "Advantages of Barium Peroxide in the Powder Synthesis of Perovskite Super Conductors" pp. 615–618, Hepp et al.

Japanese Journal of Applied Physics, vol. 26, No. 5, 1987, pp. 736–737, Kawai et al., "Preparation of High–Tc Y-/Ba-Cu-O Superconductor".

Japanese Journal of Applied Physics, vol. 26, Nos. 7–1987, pp. L1159–L1160, Fujiki et al., "Preparation of a High–TcY–Ba–Cu–O Superconductor Using Calodial Method".

Z. Phys. B Condensed Matter 64, 189–1986 Bednorz et al., "Possible High Tc Superconductivity in the Ba-La-Cu-O System".

Japanese Journal of Applied Physics, vol. 26, No. 5, May 1987, pp. L836–L837, Saito et al., "Superconductivity of Sr-La-Cu Oxides Prepared by Coprecipitation Method".

Materials and Processing Report, vol. 2, No. 10, 1988, pp. 1–9.

Proceeding of Symposiums of the 1987 Spring Meeting of Mat. Res. Soc., vol. EA-11, Morris et al., "Mobile Oxygen and Isotope Effects in the High Temperature Superconductive YBa$_2$Cu$_3$O$_{7}$".

Primary Examiner—Robert L. Stoll
Assistant Examiner—Paige C. Harvey
Attorney, Agent, or Firm—E. O. Palazzo

[57] ABSTRACT

A process for the preparation of copper oxide superconductors which comprises (1) mixing and grinding yttrium nitrate hydrate, copper nitride, and an oxidizing agent such as barium peroxide in a suitable solvent; (2) forming a paste thereof; (3) applying the paste to a substrate; (4) heating the substrate with the paste thereon; and (5) therafter cooling. The process yields copper oxide superconducting compounds in a purity of at least 80 percent.

19 Claims, No Drawings

PROCESSES FOR THE PREPARATION OF COPPER OXIDE SUPERCONDUCTORS

BACKGROUND OF THE INVENTION

This invention is generally directed to processes for the preparation of superconductors, and more specifically the present invention is directed to processes for preparing pastes that may be selected as precursors for the preparation of superconductors, including certain high temperature copper oxide superconductors. Thus, in accordance with the simple, economical process of the present invention there can be prepared superconductors of, for example, the formula $YBa_2Cu_3O_{7-x}$, wherein x is close to zero by the mixing and grinding of yttrium nitrate hydrate, an oxidizing agent, and copper nitride, adding a solvent thereto such as acetone, forming a paste thereof, heating the paste, and thereafter cooling. One specific embodiment of the present invention comprises the mixing of yttrium nitrate hydrate an oxidizing agent, such as barium peroxide, and copper nitride; grinding the aforementioned mixture; adding to the mixture a solvent such as acetone; grinding the formed mixture to enable the formation of a paste; applying the paste to a substrate such as a ceramic alumina rod; heating the rod with the paste thereon; and subsequently cooling the rod whereby there results thereon a copper oxide superconductor. With the process of the present invention, there is provided a superconductor of high purity, exceeding 95 percent in some instances, wherein only a single heating step is needed. Moreover, with the process of the present invention a paste is formed enabling it to be premanently coated on various substrates, such as ceramic rods. Typically, superconductor precursor materials for the formation of $YBa_2Cu_3O_{7-x}$ and other copper oxide superconductors are drypowders that do not form adherent coatings on substrates prior to firing, or that do not retain their form or shape prior to firing unless compressed under high pressure or placed in a mold. A paste, however, which is formed with the process of the present invention, and whose conistency and thickness may be varied, can be selected for the formation of a superconductor precursor Thus, for example, when it is desirable to coat a ceramic rod, such as an alumina rod with a copper oxide superconductor, such as $YBa_2Cu_3O_{7-x}$, this may not be accomplished simply by dipping the rod into the dry powder percursor mixture as the powder will not usually adhere uniformly to the rod surface. With an adherent paste obtained with the process of the present invention, ceramic rods can be uniformly coated by dipping the rod into the paste and heating at a temperature of from about 900° to about 975° C. During the heating process, the precursor paste converts to a superconductor such as $YBa_2Cu_3O_{7-x}$ which is uniformly coated on the rod. In a similar manner, the paste formed with the process of the present invention may be applied to other substrates to which it adheres resulting, for example, in thick films (greater than 0.1 micrometer) of superconductors. Since the paste is adherent, the substrate may assume any attitude during the firing or heating process without removal of the precursor as is the siuation with dry powders. Also, the paste obtained with the process of the present invention may be used to form wires or electrically conducting paths on a substrate by extruding the paste through a fine orifice. Thus, a circuit board may be formed on an appropriate substrate, such as alumina or silicon, that would consist of superconducting wires. Furthermore, superconducting spheres may be formed by rolling and shaping a paste having the consistency of modeling clay into the desired shape and heating the paste to a temperature of from about 900° to about 975° C.

Processes for the preparation of superconductors are known. Thus, for example, it is known that copper oxide superconductors can be prepared by high temperature, above 950° C., ceramic methods. In the aforementioned processes barium carbonate, $Y_2O_3$, and copper oxide are admixed, ground with a motar and pestle, and subsequently the resulting product is pressed into pellets. Thereafter, the products are fired in an oven at about 950° C. for about 10 hours. The pellet product after cooling is ground, and pressed a second time, and thereafter sintered at 950° C. for in excess of 10 hours. The resulting material shows a variety of superconducting properties such as zero dc resistance and the Meissner effect. Often the material is multiphased, however, with nonsuperconducting phases diluting the superconductor phase. The copper oxide superconductor resulting of the formula illustrated herein usually contains therein impurities such as nonsuperconducting phases, reference for example the *Japanese Journal Of Applied Physics,* Volume 26, No. 5, May of 1987, and the *Japanese Journal of Applied Physics,* Volume 26, No. 4, Apr. 1987, pages L498 to L501. For example, one specific contaminant present in the aforementioned superconductors is believed to be a green compound $Y_2BaCuO_5$, which in of itself does not function as a superconductor.

In Chapters 7 and 11 of the *Chemistry of High-Temperature Superconductors,* American Chemical Society, Davision et al., there is disclosed the preparation of superconductors of the formula $YBa_2Cu_3O_7$ by dissolving stoichiometric amounts of yttrium oxide, copper oxide, and barium carbonate in concentrated nitric acid. Thereafter, the solution formed is evaporated to dryness, followed by decomposition of the nitrate mixture at 500° C. The resultant grey material was then grounded mechanically and refined at 750° C., and subsequently the grinding and heating steps were repeated at 900° to 950° C. A final annealing step was then accomplished by heating the product to 950° C. in pure oxygen.

In copending application U.S. Ser. No. 188,889, the disclosure of which is totally incorporated herein by reference, there are illustrated processes for the preparation of copper oxide superconductors by mixing copper nitride, an oxidizing agent, and yttrium oxide; forming pellets of the aforementioned mixture; heating the pellets at a temperature of from about 900° to about 975° C.; and thereafter cooling said pellets.

Accordingly, while processes for the preparation of superconductors are known, there is a need for further simple, economical processes that will enable copper oxide superconductors of a high purity. More specifically, there is a need for processes that will enable the formulation of copper oxide superconductors of a purity of 80 percent, or greater, from pastes. There is also a need for efficient processes for the preparation of copper oxide superconductors from paste precusors formed by mixing stoichiometric amounts of yttrium nitrate hydrate, an oxidizing agent, and copper nitride. Also, there is a need for processes wherein high purity superconductors, exceeding 95 percent, and as high as 100 percent in some instances can be obtained with one heating step, and the product resulting has improved homogeneity.

SUMMARY OF THE INVENTION

It is therefore an object of the present invention to provide processes for the preparation of superconductors of high purity.

A further object of the present invention is the provision of an economical process for the preparation of copper oxide superconductors.

Additionally, in a further object of the present invention there are provided simple, economical, efficient processes for the preparation of high purity copper oxide superconductors from pastes.

Another object of the present invention resides in the preparation of copper oxide superconductors in a one-step process and of a purity equal to, or exceeding 80 percent.

In yet another specific object of the present invention there are provided process for the preparation from pastes of high purity copper oxide superconductors of the formula $YBa_2Cu_3O_{7-x}$, wherein x is a number close to zero, which superconductors are substantially free of impurities.

Furthermore, in yet another specific object of the present invention there are provided processes for the preparation of the aforementioned copper oxide superconductors from pastes consisting of a mixture of yttrium nitrate hydrate, oxidizing agents, and copper nitride, and wherein a single heating step is utilized.

These and other objects of the present invention are accomplished by the provision of a process for the preparation of copper oxide superconductors in high purity. More specifically, the process of the present invention comprises the mixing and grinding of yttrium nitrate hydrate, an oxidizing agent, and copper nitride in a suitable organic solvent, such as acetone, wherein there results a paste; applying the past to a substrate; heating the substrate with the paste thereon to a temperature of from about 900° to about 975° C.; and thereafter cooling to room temperature. In one specific embodiment of the present invention, there is initially formed by grinding a paste mixture of $Y(NO_3)_3 \cdot xH_2O$ wherein x is equal to or less than 6 ($x \leq 6$), an oxidizing agent, such as barium peroxide; and copper nitride ($Cu_3N$) with acetone, which paste is thin, that is of the consistency of water; or thick, that is having the appearance and consistency of hot pitch or tar. This paste can then be coated onto a substrate or preformed to a desired shape. Upon firing above 900° ° C., and preferably heating from about 900° to about 975° C. the paste converts to a ceramic material that retains its preformed shape or coating, and is superconducting at about 94° K. Normally, acetone used in grinding precursor mixtures for ceramic materials evaporates to leave a dry powder.

Another embodiment of the present invention is directed to a process for the preparation of copper oxide superconductors, especially those of the formula as illustrated herein, which comprises (1) mixing and grinding yttrium nitrate hydrate, copper nitride, and an oxidizing agent, such as barium peroxide in a suitable solvent; (2) forming a paste thereof; (3) applying the paste to a substrate: (4) heating the substrate with the paste thereon; and (5) therafter cooling.

The reactants can be mixed for various time periods; generally, however, usually mixing is accomplished for a period of from about 5 to about 10 minutes, and preferably from about 1 to about 5 minutes, preferably in a suitable device such as a motar and pestle to permit grinding of the mixture, and formation of the desired paste. Heating can be accomplished, for a period of, for example, from about 4 to about 14 hours, although other specific heating times can be selected providing the objectives of the present invention are achieved by a number of known methods including heating in a Lindberg tube furnace with an automatic controller or a Marshall II furnace with an Eurotherm controller. The high purity, up to 100 percent in some instances, superconducting product obtained can be identified by various methods including X-ray diffraction analysis, and by magnetic susceptibility measurements. The aforementioned formed paste can be applied to the substrate by, for example, dipping, rolling, doctor blade, spraying, spinning, or other solution coating techniques. Cooling, which is accomplished, for example, by known methods including the simple removal of the heating source, rates can vary from less than about 1 to several degrees per minute. High temperature materials such as alumina, quartz, silicon, metal and the like can be utilized as substrates.

Examples of solvents selected for the process of the present invention in an amount, for example, of from about 1 to about 20 percent include acetone, methyl ethyl ketone, ethyl ketone, 2-pentanone, 3-pentanone, 2-hexanone, 3-hexanone, methyl isobutyl ketone, methanol, ethanol, propanol, butanol, and the like providing the objectives of the present invention are achieved.

The invention will now be described in detail with reference to specific preferred embodiments thereof, it being understood that these examples are intended to be illustrative only. The invention is not intended to be limited to the materials, conditions, or process parameters recited herein.

EXAMPLE I

Stoichiometric amounts of yttrium nitrate hydrate, barium peroxide and copper nitride were weighed and mixed. Specifically, 3.79 grams of $Y(NO_3)_3 \cdot 5.8 H_2O$, 3.39 grams of $BaO_2$ (barium peroxide), and 2.05 grams of $Cu_3N$ were mixed together and ground in an aluminum oxide mortar and pestle for a period of 3 minutes. Thereafter, 1.8 milliliters of acetone was added to the mixture and grinding continued for an additional minute to form a paste having the consistency of warm tar. An alumina rod measuring 9 centimeters by 3 millimeters in diameter was dipped into the paste to cover 5 centimeters of the rod. The rod was then suspended across the walls of an alumina combustion boat to minimize contact between the paste and the boat, and heated in a tube furnace to 940° C. for 10 hours under flowing oxygen. Thereafter, the rod was cooled to room temperature at the rate of 2° C. per minute while still under flowing oxygen. There resulted a superconductor with a purity of 99 percent of the formula $YBa_2CU_3O_{7-x}$, as determined by X-ray analysis, coating the rod.

EXAMPLE II

The paste prepared in accordance with the process of Example I was allowed to stand for 15 minutes in the open air with only occasional mixing and grinding. During this period, the paste thickened in consistency to the point where 1 centimeter diameter balls or spheres were formed by hand-rolling the thick paste. These solid spheres were then placed in an alumina boat and heated by repeating the process steps of Example I. After cooling, the spheres had shrunk by about 30 per-

EXAMPLE III

The procedure of Example I was repeated with the exceptions that the mixture contained 7.58 grams of $Y(NO_3)_3 \cdot 5.8H_2O$, 6.78 grams of $BaO_2$, and 4.10 grams of $Cu_3N$. Also, 8 milliliters of acetone was added to the ground mixture to form a paste of a thinner consistency than that of the paste of Example I. The thinner paste was allowed to thicken in the mortar and pestle for approximately 5 minutes with light intermittent mixing during this period. The paste was then loaded into a plastic syringe that had a 2 millimeter orifice, and extruded through the syringe onto an alumina plate measuring 1½ by 2½ inches. Several interconnecting line patterns were applied. The alumina plate was then heated in the manner described in Example I. The resulting plate after cooling showed the original interconnected line patterns, which were now about 1 to 1.5 millimeters across, were electrically conducting at room temperature (23° C.) and were superconducting at 94° K.

Substrates other than alumina may be selected such as silicon, steel, and the like.

EXAMPLE IV

The procedure of Example I was repeated for a mixture of 7.58 grams $Y(NO_3)_3 \cdot 5.8 H_2O$, 6.78 grams of $BaO_2$, and 4.10 grams $Cu_3N$. Five milliliters of acetone were then added to the ground mixture to form a paste with the mortar and pestle. A portion of the paste sufficient to cover a 11/2 and 21/2 inch aluminum oxide plate was applied to the plate by a doctor blade. This plate was then heated in the manner described in Example I. After cooling, the plate contained a uniform layer of superconducting $YBa_2Cu_3O_{7-x}$ with a purity of 95 percent adhered to its surface. The layer measured approximately 100 micrometers thick. A similar layer measuring 50 micrometers thick was prepared on a second alumina substrate using approximately one-half the thickness of paste.

EXAMPLE V

The procedure of Example I was repeated except that 1.8 milliliters of ethanol were used in place of acetone. A paste similar to that of Example I was obtained, and coated an alumina rod as described in the example. After cooling, the rod contained a superconducting coating of $YBa_2Cu_3O_{7-x}$ as determined by X-ray analysis and electrical conductivity measurements at 94° K.

A rod coated with superconductor could be used as a frictionless bearing when inserted into the bore of a magnet. Thus, the rod can be utilized as the superconductor itself.

Although the invention has been described with reference to specific preferred embodiments, it is not intended to be limited thereto, rather those skilled in the art will recognize variations and modifications may be made therein which are within the spirit of the present invention and within the scope of the following claims.

What is claimed is:

1. A process for the preparation of copper oxide superconductors which comprises (1) mixing stoichiometric amounts of and grinding yttrium nitrate hydrate, copper nitride, and an oxidizing agent in a suitable solvent; (2) forming a paste thereof; (3) applying the paste to a substrate; (4) heating the substrate with the paste thereon; and (5) therafter cooling.

2. A process in accordance with claim 1 wherein the oxidizing agent is barium peroxide.

3. A process in accordance with claim 1 wherein mixing and grinding is for a period of from about 1 to about 5 minutes.

4. A process in accordance with claim 1 wherein heat is in the presence of oxygen.

5. A process in accordance with claim 1 wherein heating is in the presence of a mixutre of oxygen, and helium.

6. A process in accordance with claim 1 wherein heating is at a temperature of from about 900° to about 975° C.

7. A process in accordance with claim 1 wherein heating is for a period of from about 4 to about 15 hours.

8. A process in accordance with claim 1 wherein the substrate is a ceramic or metal rod.

9. A process in accordance with claim 8 wherein the rod is comprised of alumina.

10. A process in accordance with claim 1 wherein heating is in a combustion furnace.

11. A process in accordance with claim 1 wherein cooling is to room temperature.

12. A process in accordance with claim 1 wherein cooling is over a period of from about 1 minute to about 10 hours.

13. A process in accordance with claim 1 wherein the purity of the superconductor formed is from about 80 to about 95 percent.

14. A process in accordance with claim 1 wherein the superconductor formed from the substrate is of the formula $YBa_2Cu_3O_{7-x}$ wherein x is a number close to zero.

15. A process in accordance with claim 1 wherein heating is for 10 hours at a temperature of about 900° C.

16. A process in accordance with claim 1 wherein the solvent is acetone.

17. A process in accordance with claim 1 wherein the hydrate is $Y(NO_3)_3 \cdot xH_2O$ wherein x is a number of from 1 to about 6.

18. A process for the preparation of copper oxide superconductors which comprises (1) preparing a mixture consisting essentially of yttrium nitrate hydrate, copper nitride, and barium peroxide in a suitable solvent; (2) forming a paste thereof; (3) applying the paste to a substrate; (4) heating the substrate with the paste thereon; and (5) thereafter cooling.

19. A process for the preparation of copper oxide superconductors which consists essentially of (1) preparing a mixture consisting essentially of yttrium nitrate hydrate, copper nitride, and barium peroxide in a suitable solvent; (2) forming a paste thereof; (3) applying the paste to a substrate; (4) heating the substrate with the paste thereon; and (5) thereafter cooling.

* * * * *